United States Patent [19]

Kneip, Jr.

[11] 4,173,775
[45] Nov. 6, 1979

[54] SELECTIVE EXCITATION OF COILS COMPRISING A SUPERCONDUCTING MAGNET

[75] Inventor: George D. Kneip, Jr., Menlo Park, Calif.

[73] Assignee: Varian Associates, Inc., Palo Alto, Calif.

[21] Appl. No.: 879,293

[22] Filed: Feb. 21, 1978

[51] Int. Cl.$^2$ .......................................... H01H 47/00
[52] U.S. Cl. .................................... 361/141; 324/320
[58] Field of Search .......... 324/0.5 R, 0.5 A, 0.5 AH; 335/216; 307/134, 135; 361/141

[56] References Cited

U.S. PATENT DOCUMENTS

| | | | |
|---|---|---|---|
| 3,412,320 | 11/1968 | Marshall | 324/0.5 R |
| 3,419,794 | 12/1968 | Weaver, Jr. et al. | 324/0.5 AH |
| 3,419,904 | 12/1968 | Weaver et al. | 361/141 |
| 3,549,952 | 12/1970 | Sole | 361/141 |
| 3,826,972 | 7/1974 | Day et al. | 324/0.5 AH |
| 4,084,209 | 4/1978 | Hilal | 361/141 |

Primary Examiner—Harry E. Moose, Jr.

Attorney, Agent, or Firm—Stanley Z. Cole; Edward H. Berkowitz

[57] ABSTRACT

Thermal isolation of a cryostat is improved for a superconducting solenoid having a plurality of separately energizable coils or winding sections by reducing the number of conductors required to selectively energize the persistence switch controlling a particular winding section. As a consequence, the dimensions of the vent and fill tube openings of the cryostat which accommodate these conductors may be reduced. In one embodiment a diode is incorporated in series with heating element of each switch. The switches are connected to form a steering network to control as many as $p \leq n(n-1)$ separate coils using n conductors to actuate p persistence switches. In another embodiment $n(n-1)/2$ coils are similarly controlled with n conductors using the time-current response of persistence switches without diodes. Still another embodiment utilizes a binary to hexadecimal converter within the cryostat to permit n externally generated signal conductor to select as many as $p \leq 2^n - 1$ persistence switches.

10 Claims, 7 Drawing Figures

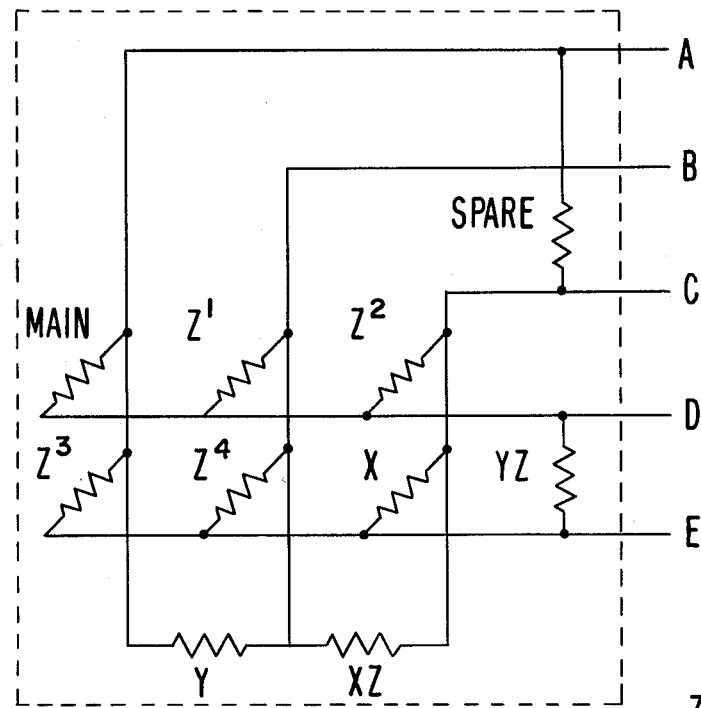
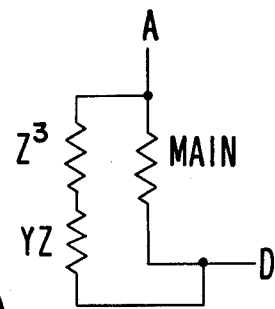
FIG.5
FIG.5A
FIG.6
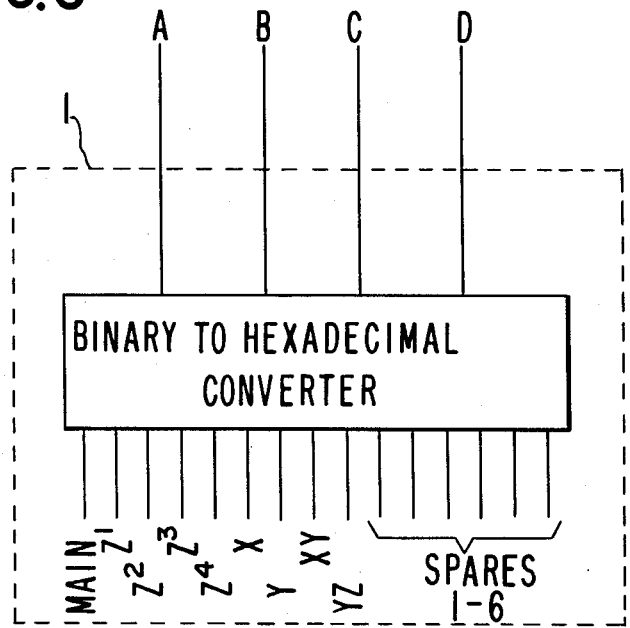

SELECTIVE EXCITATION OF COILS COMPRISING A SUPERCONDUCTING MAGNET

BACKGROUND OF THE INVENTION

This invention relates to superconducting magnet apparatus and in particular to means for effecting transition between persistent and non-persistent modes for multi-coil superconducting solenoids.

Superconducting magnet apparatus has been especially useful for gyromagnetic resonance spectrometers. Such a spectrometers requires the greatest uniformity and stability for its magnetic field. Stability is secured in a superconducting magnet operating in a persistent mode. Uniformity is obtained by correcting the inhomogeneities in the magnetic field through an arrangement of a plurality of gradient correcting coils which supplement the main solenoid. These gradient correcting coils, or shim coils, are utilized to offset residual magnetic field gradients which affect the uniformity of the magnetic field. In the context of certain experiments the shim coils may be employed to provide a known, controllable gradient.

A superconducting magnet is housed within a cryostat designed to maintain the temperature of the superconductor below the transition temperature. Ordinarily this requires maintaining the superconducting elements at temperatures not far removed from the boiling point of liquid helium, that is to say 4.2 K° (at atmospheric pressure). The need to maintain sufficient liquid helium in the cryostat thus becomes a practical limitation upon the economics of operating such spectrometers. It is known in the prior art to improve the thermal-isolation of the liquid helium from room temperature environment by several means. This is often expressed for a particular apparatus in terms of the rate at which the liquid helium boils away.

It was recognized in the prior art that the plurality of electrical conductors required by the superconducting magnets form a thermal path from the interior of the cryostat to the outside thereof when these conductors are in place to initiate persistent currents in the magnet. For example, U.S. Pat. No. 3,412,320 describes a specific arrangement for current leads and their placement to minimize thermal losses.

SUMMARY OF THE PRESENT INVENTION

It is an object of the present invention to further reduce the rate of evaporation of liquid helium from the cryostat of a superconducting gradient corrected magnet.

It is a feature of the present invention to minimize the number of control conductors required for the control of the plurality of gradient correcting superconducting coils.

One feature of the invention is the provision of a number, n, of current leads to control as many as persistence switches whereby n(n−1) does not exceed p.

Another feature of the invention is the provision of a number n of current leads in another embodiment to control p persistence switches whereby n(n−1)/2 does not exceed p.

This object is accomplished in one embodiment by arranging in communicating array, the superconducting persistence switches controlling the various solenoids, each such switch including a diode for selective response to the applied switch driving current.

In another embodiment these objects are accomplished wherein the response of the persistence switches themselves are utilized to select the excitation of a desired superconductor when the switches communicate to form an array.

BRIEF DESCRIPTION OF THE FIGURES

FIG. 5 shows another embodiment of the invention for controlling a set of as many as ten superconductive persistence switches without the use of diodes.

FIG. 6 shows yet another embodiment of the invention for controlling a set of as many as fifteen persistence switches from four conductors.

DETAILED DESCRIPTION OF THE INVENTION

Figure 1:
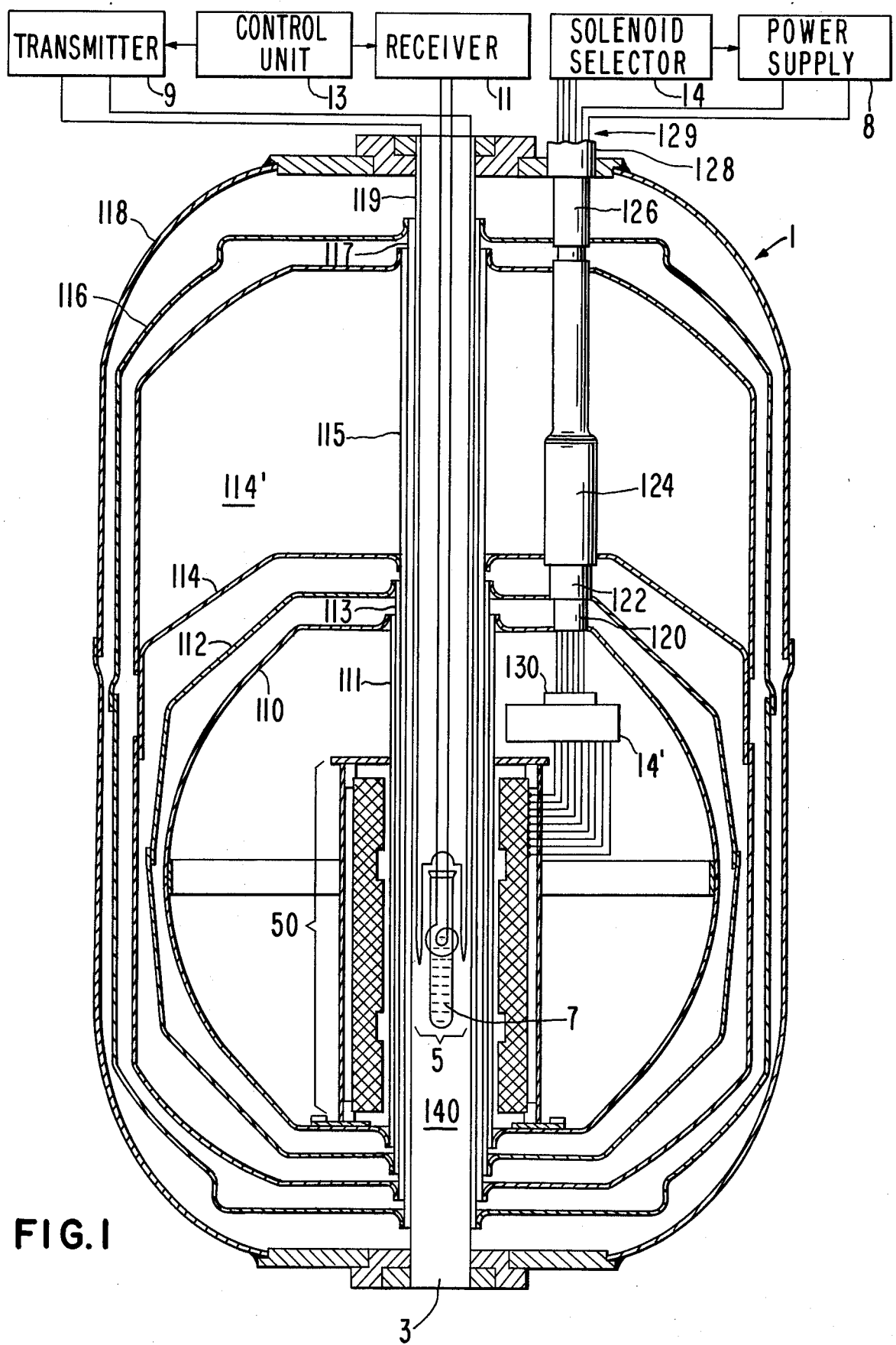
FIG. 1 shows a cryostat housing a superconducting magnet.

Turning now to FIG. 1 there is shown a cryostat 1 housing the superconducting magnet system for a nuclear magnetic resonance spectrometer. The superconducting magnet is housed in a cryostat 1 having a bore 3 for room temperature access to the magnetic field created by apparatus within cryostat 1. A probe 5 contains a sample 7 for analysis. A power supply 8, a transmitter 9, and receiver 11, control unit 13 form the basis of an NMR spectrometer. Such instruments may include additional apparatus such as data processing and display equipment, not germane to the present inventive contribution. The superconducting magnet system includes a superconducting magnet assembly 50 within a hollow quasi-spherical control reservoir 110. Assembly 50 includes a main solenoid, four coaxial gradient correcting coils and four additional non-coaxial gradient correcting coils. The construction and disposition of gradient correcting coils (not further detailed in FIG. 1) in a superconducting magnet is known in the art and not the subject of this invention. Control reservoir 110 is filled with a low temperature coolant such as liquid helium for maintaining the magnet assembly 50 at a temperature below the superconducting transition temperature whereby the coils comprising magnet assembly 50 are maintainable in a superconducting state. Reservoir 110 is isolated from ambient temperature by means of a plurality of consecutively nested surrounding chambers 112, 114, 116 and 118. Chambers 112, 114, 116 and 118 are mutually communicating and evacuated to a very low pressure, as for example $10^{-6}$ torr to minimize thermal conduction therethrough. This plurality of chambers form a system of radiation shields to reduce heat transport by radiation from the exterior of the cryostat. Chamber 114' is a liquid nitrogen reservoir which cools the walls of chamber 114, reducing heat transport by radiation to liquid helium chamber 110.

Each of the nested chambers share a common axis defined by coaxial tubes 111, 113, 115, 117 and 119 each joined to corresponding chambers 110, 112, 114, 116 and 118. The axis coincides with the axis of superconducting magnet assembly 50 and the nested cylindrical regions now defined provide access to the magnetic field region 140 for samples to be analyzed.

Vent and fill tube 120 provides communication between the outside of the cyrostat and the interior of central chamber 110. Vent and fill tube 120 of stainless steel for thermal isolation is nested within coaxial cylinders 122, 124, 126 and 128 all of which are fabricated from aluminum. Electrical conductors 129 for power and control of the superconducting magnet assembly 50 are led through tubes 120 and engage a connector 130 located within liquid helium reservoir 110. It is understood that these conductors are only introduced into the cryostat when it is desired to adjust or otherwise alter the operation of superconducting magnet. The number of conductors 129 which must be accommodated imposes a lower limit on the inner diameter of tube 120. When conductors 129 engage connector 130, the boil-off rate through conduction depends upon the diameter and wall thickness of the stainless steel tube 20 and the total area of the conductors led therethrough. The contribution to the boil-off rate from convection and direct radiation depends upon the difference between the total cross sectional area of the several electrical conductors and the interior area of the tube 120, that is, the "open" area.

The details of the cryostat construction are the subject of copending Pat. applications Ser. Nos. 879,289 and 879,292 filed contemporaneously herewith and assigned to the assignee of the present invention.

Figure 2:
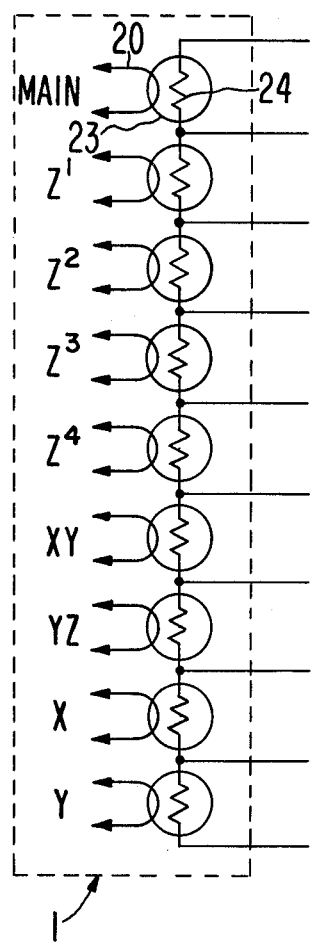
FIG. 2a illustrates a conventional persistence switch.
FIG. 2b shows a conventional arrangement for a set of nine superconducting persistence switches.

It should be appreciated that an excitation current is merely required to establish the circulating current in a superconducting loop providing a magnetic field, after which a superconducting shunt is enabled, the current source removed and no further current source is required to maintain the current and consequent magnetic field. A superconducting solenoid may therefore be driven by a current source or alternatively a superconducting state may be established for a shunt placed across the terminals of such a solenoid and the current source removed to achieve a persistent current in the solenoid. It is common in the art to employ a persistence switch to control transitions between the persistent mode and the externally driven mode for a superconducting circuit. A persistence switch is formally akin to a monostable relay. The superconductivity of a shunt is destroyed returning the superconducting state of the shunt to the normal state thereby terminating the persistent mode. A solenoid selector 14 is used to initiate or destroy persistent currents is a selected solenoid by controlling a selected one of the set of persistence switches schematically indicated by box 14. It will be understood that the persistence switches of the apparatus are distributed about magnet assembly 50 as appropriate for connection to the respective coils comprising assembly 50. FIG. 2 shows a form of such a switch commonly employed for this purpose. Superconductor 20, connected across the input power terminals of a superconducting circuit (not shown) passes through a dielectric member 23 in which is also embedded a resistive heating element 24. When heating current is applied to the resistive element 24, the superconducting state of shunt 20 is destroyed. When heating current is removed, the shunt 24 is cooled by the coolant (liquid helium) and returns to its superconducting state.

FIG. 2 also illustrates a prior art arrangement for controlling nine coils or sections of windings with nine persistence switches. For this arrangement, to control p persistence switches, p+1 electrical conductors are required for communication to the exterior of the cryostat. Because these electrical conductors are also thermal conductors, reduction in the number of conductors will improve the degree of thermal isolation for the interior of the cryostat.

Figure 3:
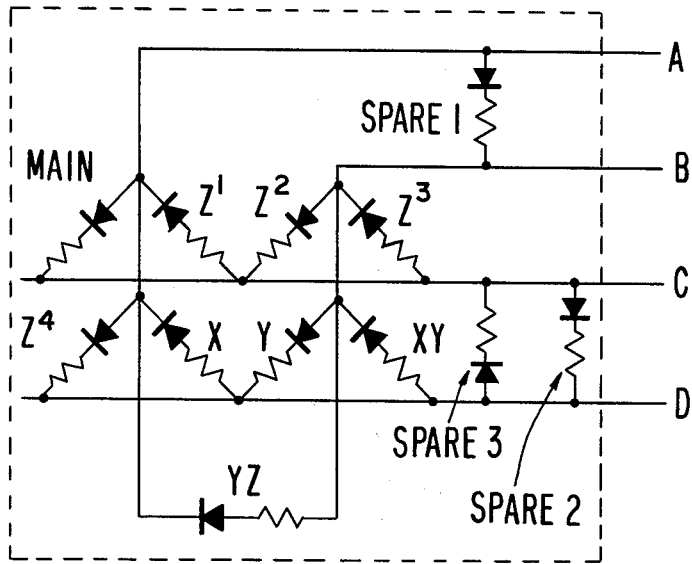
FIG. 3 shows an embodiment of the invention for controlling a set of as many as twelve superconductive persistence switches using diodes.

In the embodiment of FIG. 3, four conductors are used to actuate up to 12 persistence switches. Each persistence switch now incorporates a diode in series with the switch heating element. The persistence switches, each labeled by its function are in a one-to-one relationship with each of the main solenoid and eight gradient correcting solenoids, each of the latter labeled by the coordinate of the gradient correction function which it accomplishes. Four correcting solenoids labeled $Z^1$, $Z^2$, $Z^3$ and $Z^4$ are employed to trim the homogeneity of the Z component of the field (the cylindrical axis of the main solenoid coinciding with the Z axis). The remaining four shim coils correct magnetic field gradients in the directions indicated by their respective labels. Three additional persistence switches may be accommodated with this arrangement. The analysis of the circuit of FIG. 3 is aided by the following table:

TABLE I

| | FOUR CONDUCTOR DIODE ARRAY | | | |
|---|---|---|---|---|
| conductors | A | B | C | D |
| A | — | spare 1 | MAIN | $Z^4$ |
| B | YZ | — | $Z^2$ | Y |
| C | $Z^1$ | $Z^3$ | — | spare 2 |
| D | X | XY | spare 3 | — |

In the above table, excitation of any two of conductors A, B, C, or D may be selected with the further selection of forward or reverse bias. The number of off-diagonal elements of a two dimensional square array are $n \times n - n$: therefore the embodiment of FIG. 1 can control $n(n-1)$ persistence switches.

Copending U.S. Pat. application No. 879,294 assigned to the assignee of the present invention describes a novel form of persistence switch, adapted to the above described embodiment wherein the heat evolved by the forward biased diode is employed to control the superconductive transition.

Figure 4:
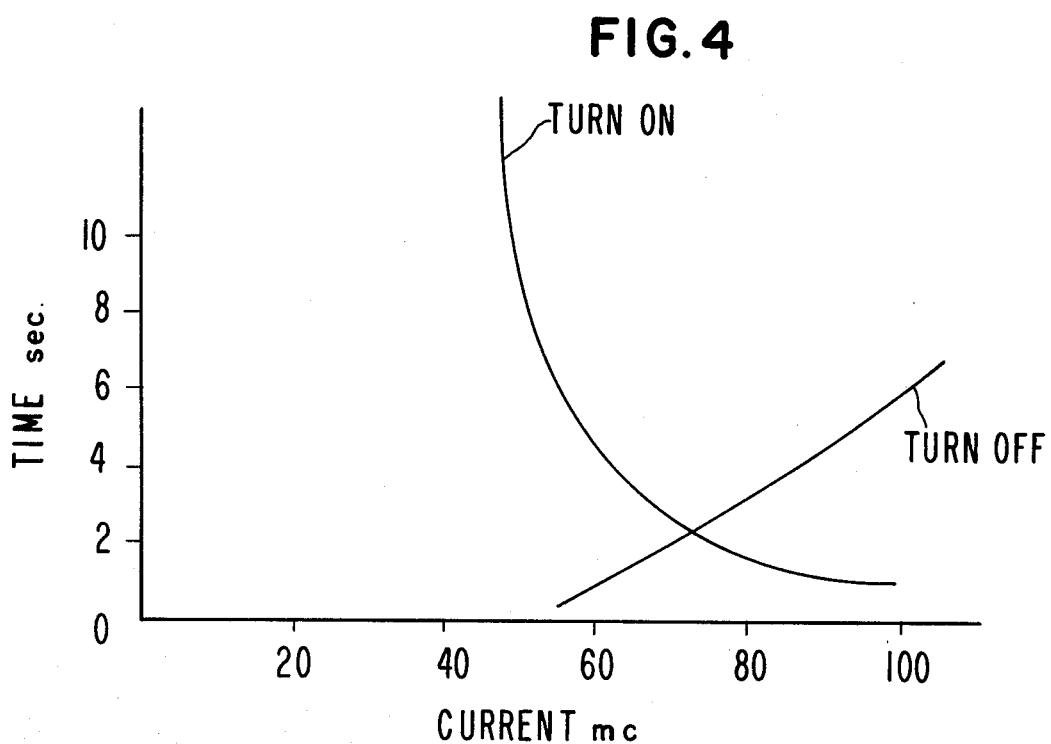
FIG. 4 shows the typical time-current characteristics for a superconductive persistence switch.

In another embodiment of the invention the resistance of a purely resistive persistence switch heater is employed for switch selection. Because of thermal conductivity between the helium bath and the heated part of the superconductor of the switch, there is a threshold current necessary to actuate the switch. FIG. 4 shows the turn-on and turn-off characteristics for a typical persistence switch. A switch of this design which draws for example, 60 ma, will require on the order of 5 seconds to turn on, that is for the temperature of the shunt to go above the transition point when the current to the switch is supplied, whereas the superconducting state is restored in times of the order of one second when current is removed from the heating element of the switch.

An embodiment utilizing the current response is indicated in FIG. 5. Again it is desired to selectively excite any of nine superconducting coils. The corresponding persistence switches are again interconnected to form an array which may be further characterized for any selected pair of conductors as two series connected switches in parallel with the "selected" switch. Because the switch input resistances are equal, when a given current is applied to cause, for example, 65 ma to flow in the selected switch of resistance R, only 32.5 ma flows in the loop formed by the paralleled series combination of resistance 2R as shown in FIG. 5A. In FIG. 5A conductors A and C are selected to actuate the switch controlling the main solenoid. Identical persistence switches controlling $Z^3$ and YZ correcting coils do not draw sufficient current to actuate.

Analysis of the array of FIG. 5 is again aided by reference to table II:

TABLE II

| FIVE CONDUCTOR PERSISTENCE SWITCH ARRAY | | | | |
|---|---|---|---|---|
| | A | B | C | D | E |
| A | — | Y | spare | MAIN | $Z^3$ |
| B | | — | XZ | $Z^1$ | $Z^4$ |
| C | | | — | $Z^2$ | X |
| D | | | | — | YZ |
| E | | | | | — |

Because there is no distinction in current polarity in the switch heating coils only one-half of the off-diagonal elements are distinguishable. Thus, as many as $n(n-1)/2$ switches may be selected by n conductors.

Yet a third embodiment may be discerned for minimizing the number n of electrical, and hence thermal conductors for controlling p persistence switches. Turning now to FIG. 6, a number n (here four) conductors A through D communicate with a binary to hexadecimal (octal) converter within cryostat 1 to utilize maximum information transmission capability provided by the n conductors. Such encoding/decoding converters are known and the details of construction are outside the scope of the present invention. Such a converter provides the capability for n conductors to control $2^n-1$ independent circuits such as persistence switches.

In operation the total boil-off rate for liquid helium from a prior art cryostat housing a magnet comparable to the present magnet 50 was approximately 30 CC per hour. A superconducting magnet utilizing the control arrangement of FIG. 3 exhibits a boil-off rate of about 6 CC per hour. In part, this reduction is attributable to the greatly reduced area of the fill and vent tubes to accommodate the fewer conductors required during changing of the superconducting coils. At all times the dimensions of the tube 120 substantially reduce the thermal transport by conduction and radiation to the liquid helium reservoir 110.

The present invention is not limited to control of solenoids and coil windings. A number of persistence switches may be employed for other control purposes and come within the scope of this invention wherein the number of persistence switch control conductors communicating between interior and exterior of a cryostat are to be minimized.

Since many changes can be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. In a superconducting magnet system, said system housed in a cryostat and said system comprising means forming a superconductive solenoid to provide a main magnetic field and a plurality of gradient correcting superconducting coils, said solenoid means and each said gradient correcting coils adapted for selective excitation, a plurality of p persistence switch means to effect transitions between the persistent mode and the nonpersistent mode, each said solenoid and gradient correcting coil separately controlled by a respective said persistence switch, the improvement comprising a diode in series relationship with each said persistence switch means whereby a plurality of two-terminal directional persistence switching means is formed, a number, n, of conductors, where $n<p$, for communicating between the exterior and the interior of said cryostat to control said switch means, each said n conductors contacting one terminal of each of $n(n-1)$ of said two-terminal directional switching means whereby the operation of a desired persistence switch is selectable from the exterior of said cryostat.

2. The apparatus of claim 1 wherein p does not exceed $n(n-1)$.

3. In a superconducting magnet system, said system housed in a cryostat and said system comprising means forming a superconductive solenoid to provide a main magnetic field and a plurality of gradient correcting coil adapted for selective excitation, a plurality of p persistence switch means, each said persistence switch comprising two-terminals for actuation of said switch, said persistence switch means responsive to a current exceeding a threshold characteristic of said persistence switch means, each said solenoid and gradient correcting coil separately controlled by one of said persistence switch to effect transitions between the persistent mode and non-persistent mode of operation for such coils and solenoid, the improvement comprising a number, n of conductors, whereby $n<p$, for communicating between the exterior and the interior of said cryostat to control said switch means, each said n conductors contacting one actuating terminal of each of $n(n-1)/2$ of said persistence switches whereby the operation of a desired persistence switch is selectable from the exterior of said cryostat.

4. The apparatus of claim 3 wherein p does not exceed $n(n-1)/2$.

5. In a superconducting magnet system, said system housed in a cryostat and said system comprising means forming a superconductive solenoid to provide a main magnetic field and a plurality of gradient correcting superconducting coils, said solenoid means and each said gradient correcting coils adapted for selective excitation, a plurality of p persistence switch means to effect transitions between the persistent mode and the non-persistent mode, each said solenoid and gradient correcting coil separately controlled by a respective said persistence switch, the improvement comprising a binary to hexadecimal converter within said cryostat a number, $n<p$, of conductors for communicating a binary pattern of signals between the exterior of said cryostat and said converter, the output of said converter selecting one said switch means in response to said pattern of signals established on said conductors.

6. The apparatus of claim 1 wherein p does not exceed $2^n-1$.

7. A superconducting magnet system comprising
means forming a superconducting solenoid for providing a main magnetic field, said means housed in a cryostat, a plurality of superconducting magnetic field gradient coils for correcting magnetic field gradients, said gradient coils housed in said cryostat, a plurality of p persistence switch means, each persistence switch comprising superconducting output means and a control means for effecting transitions between normal and superconducting states of said output means, each said gradient coil and solenoid connected to the output terminals of at least one corresponding persistence switch, a number, n, of conductors, where $n<p$ for communicating signals between the exterior and the interior of said cryostat to control said persistence switch means, and means for associating signals present on said conductors with a selected persistence switch control means whereby any said persistence switch is selectively controlled and the thermal path to the interior of said cryostat is minimized.

8. The apparatus of claim 7 wherein said associating means comprises a diode in series relationship with a control means of each said persistence switch whereby a directionally controlled persistence switch is formed, said directionally controlled persistence switches and said conductors interconnected to uniquely select as many as $n(n-1)$ persistence switches from signals present on said n conductors.

9. The apparatus of claim 7 wherein said associating means comprises the interconnection of said persistence switch control means and the n conductors to form, for any selected pairs of said n conductors, a series circuit combination of two persistence switches, said combination in parallel circuit combination with another persistence switch, said another persistence switch connected in series relationship between said selected pair of conductors, whereby as many as $n(n-1)/2$ persistence switches may be controlled by signals present on said n conductors.

10. The apparatus of claim 7 wherein said associating means comprises a binary to hexadecimal converter for decoding the signals present on said conductors to select a desired persistence switch for operation, whereby as many as $2m-1$ persistence switches may be controlled from the signals present on said n conductors.

* * * * *